(12) United States Patent
Kaneko et al.

(10) Patent No.: US 6,631,152 B2
(45) Date of Patent: Oct. 7, 2003

(54) SURFACE EMITTING SEMICONDUCTOR LASER AND METHOD OF MANUFACTURING THE SAME

(75) Inventors: Tsuyoshi Kaneko, Suwa (JP); Takayuki Kondo, Suwa (JP); Tetsuo Nishida, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 20 days.

(21) Appl. No.: 09/818,861

(22) Filed: Mar. 28, 2001

(65) Prior Publication Data

US 2002/0044581 A1 Apr. 18, 2002

(30) Foreign Application Priority Data

Mar. 29, 2000 (JP) .......................... 2000-091803

(51) Int. Cl.$^7$ ................................. H01S 5/00
(52) U.S. Cl. .......................... 372/46; 372/45
(58) Field of Search ...................... 372/45–46

(56) References Cited

U.S. PATENT DOCUMENTS 6,256,331 B1 * 7/2001 Kitoh et al. .................. 372/46
6,347,106 B1 * 2/2002 Dijaili et al. ................. 372/46

* cited by examiner

*Primary Examiner*—Paul Ip
*Assistant Examiner*—James Menefee
(74) *Attorney, Agent, or Firm*—Oliff & Berridge, PLC (57) ABSTRACT

A surface emitting semiconductor laser of the present invention comprises a resonator formed on a semiconductor substrate having Miller indices (100). The resonator includes a pillar portion, and a current constriction layer is formed in this pillar portion. In the plane including the current constriction layer, the periphery of the pillar portion includes arc-shaped portions approximating parts of an inner edge of the current constriction layer. The arc-shaped portions are formed in the <010> direction, <001> direction, <0-10> direction, and <00-1> direction from the center of the inner edge of the current constriction layer, and are formed substantially in concentric circles with the part of the inner edge shape.

10 Claims, 10 Drawing Sheets

SURFACE EMITTING SEMICONDUCTOR LASER AND METHOD OF MANUFACTURING THE SAME

BACKGROUND OF THE INVENTION

1. Field of the Invention

The present invention relates to a surface emitting semiconductor laser which emits laser light in a direction perpendicular to a semiconductor substrate, and a method of manufacturing the same.

2. Description of Related Art

A surface emitting semiconductor laser is a semiconductor laser which emits laser light in a direction perpendicular to a semiconductor substrate, with a resonator provided on a semiconductor substrate in a direction perpendicular to the semiconductor substrate. This resonator generates then emits the laser light, and comprises a reflecting layer, active layer, and reflecting layer, in that order.

As one way of increasing the efficiency of a surface emitting semiconductor laser, it has been proposed to form a current constriction layer in a part of the reflecting layer, and this construction is widely adopted. This current constriction layer is formed by first forming a current constriction layer formation layer (a layer for forming the current constriction layer) from an AlAs layer on part of the reflecting layer, then oxidizing the current constriction layer formation layer from the lateral surface. Here the within the current constriction layer an unoxidized part of the current constriction layer formation layer remains. As a result, the current constriction layer has an inner edge and an outer edge, in a so-called doughnut shape.

Outstanding characteristics that can be cited of a surface emitting semiconductor laser compared with an edge-emitting laser, are that the direction of laser emission is uniform, and can be made small. Therefore, a surface emitting semiconductor laser holds great promise for application as a light source in optic fiber communications or optical parallel data processing.

In particular, when for example a surface emitting semiconductor laser is used as the light source in optical communications using optic fiber, when the coupling efficiency with the optic fiber is taken into consideration, the laser light emitted from a surface emitting semiconductor laser preferably has a single lateral mode, and a beam shaped close to a true circle. To obtain a surface emitting semiconductor laser with a beam of such a shape, it is preferable for the inner edge of the current constriction layer described above to be more close to a true circle.

However, as described above, since the current constriction layer is formed by oxidation of the current constriction layer formation layer from the lateral surface, because of the oxidation conditions it is difficult to control the shape of the inner edge to be closer to a true circle.

SUMMARY OF THE INVENTION

The objective of the present invention is the provision of a surface emitting semiconductor laser having a single transverse mode, and such that laser light with a beam shape closer to a true circle can efficiently be obtained, and a method of manufacturing thereof.

(A) According to the present invention, there is provided a surface emitting semiconductor laser which has a semiconductor substrate having Miller indices (100), and a resonator formed on the semiconductor substrate, to emit laser light from the resonator in a direction perpendicular to the semiconductor substrate, wherein:

a pillar-form semiconductor deposition is provided in at least a part of the resonator;

the pillar-form semiconductor deposition includes a current constriction layer;

a periphery of the pillar-form semiconductor deposition has arc-shaped portions which are similar to parts of an inner edge of the current constriction layer, in a plane including the current constriction layer; and the arc-shaped portions are located in the <010> direction, <001> direction, <0-10> direction and <00-1> direction from the center of the inner edge of the current constriction layer.

In the present invention, "semiconductor substrate having Miller indices (100)" refers not only to a semiconductor substrate having Miller indices (100), but also to a substrate having a substrate surface inclined at a small angle (up to about 5 degrees) to the (100) plane.

In addition, "<010> direction," "<001> direction," "<0-10> direction," and "<00-1> direction" refer to the crystalline orientation in a semiconductor substrate having Miller indices (100).

By means of this surface emitting semiconductor laser, laser light with a beam shape closer to a true circle can be obtained. This is described in more detail in the embodiments of the present invention.

The surface emitting semiconductor laser has some features such as following examples (1) to (9).

(1) The arc-shaped portions and the parts of the inner edge of the current constriction layer may be formed in approximately concentric circles.

(2) The arc-shaped portions may be formed by splitting the inner edge of the current constriction layer in the <01-1> direction, <011> direction, <0-11> direction and <0-1-1> direction from the center of the inner edge, and by projecting the split parts of the inner edge of the current constriction layer respectively in the <010> direction, <001> direction, <0-10> direction and <00-1> direction.

In the present invention, "<01-1> direction," "<011> direction," "<0-11> direction," and "<0-1-1> direction" refer to the crystalline orientation in a semiconductor substrate having Miller indices (100).

By means of this construction, the above described benefit can be obtained.

(3) The distances from the center of the inner edge of the current constriction layer to the arc-shaped portions may be approximately equal.

(4) The arc-shaped portions may have the shape of the inner edge of the current constriction layer divided into fourth.

(5) The periphery of the pillar-form semiconductor deposition except for the arc-shaped portions may be formed outside line segments joining adjacent of the arc-shaped portions, in the plane including the current constriction layer. By means of this construction, when the pillar-form semiconductor deposition is oxidized from the lateral surface to form the current constriction layer, the shape of the current constriction layer can be controlled to be a circle.

(6) The periphery of the pillar-form semiconductor deposition except for the arc-shaped portions may comprise curved lines, in the plane including the current constriction layer.

(7) The periphery of the pillar-form semiconductor deposition except for the arc-shaped portions may comprise straight lines, in the plane including the current constriction layer.

(8) A strain application portion which generates a strain in the active layer may be formed in the pillar-form semiconductor deposition; and the strain application portion may be formed on the periphery of the pillar-form semiconductor deposition except for the arc-shaped portions, in the plane including the current constriction layer.

By means of this construction, by forming the strain application portion in the pillar-form semiconductor deposition, the polarization of the laser light can be controlled.

(9) The inner edge of the current constriction layer may be a true circle.

(B) According to the present invention, there is provided a method of manufacturing a surface emitting semiconductor laser comprising the steps of:

(a) laminating a semiconductor deposition layer to form a layer for forming a current constriction layer on a surface of a semiconductor substrate having Miller indices (100);

(b) etching the semiconductor deposition layer to form a pillar-form semiconductor deposition, in which:

in the plane including the layer for forming the current constriction layer, an inner edge of the current constriction layer is designed to have a predetermined shape; and a periphery of the pillar-form semiconductor deposition includes arc-shaped portions which are similar to parts of the designed inner edge of the current constriction layer and located in the <010> direction, <001> direction, <0-10> direction and <00-1> direction from the center of the inner edge of the current constriction layer; and (c) oxidizing the layer for forming the current constriction layer from lateral surfaces to form the current constriction layer having a substantially the same shape as the designed predetermined shape.

According to this manufacturing method, the shape of the inner edge of the current constriction layer is previously designed as a predetermined shape, and then based on the designed shape of the inner edge of the current constriction layer, the pillar-form semiconductor deposition is formed with its periphery of the predetermined shape. That is to say, the pillar-form semiconductor deposition is formed with its periphery reflecting the shape of the inner edge of the current constriction layer, and a current constriction layer can be formed having an inner edge substantially the same shape as the designed shape. In particular, by forming the inner edge of the current constriction layer to be a circle, a surface emitting semiconductor laser can be obtained which emits laser light with a beam shape closer to a true circle.

The method of manufacturing a surface emitting semiconductor laser has some features such as following examples (1) to (5).

(1) In the step (b), the arc-shaped portions and the parts of the designed inner edge of the current constriction layer may be formed in approximately concentric circles.

(2) In the step (b), the arc-shaped portions may be formed by splitting the designed inner edge of the current constriction layer in the <01-1> direction, <011> direction, <0-11> direction and <0-1-1> direction from the center of the inner edge, and by projecting the split parts of the inner edge of the current constriction layer respectively in the <010> direction, <001> direction, <0-10> direction and <00-1> direction.

(3) In the step (b), the distances from the center of the designed inner edge of the current constriction layer to the arc-shaped portions may be approximately equal.

(4) In the step (b), the arc-shaped portions may be formed to have the shape of the designed inner edge of the current constriction layer divided into fourth.

(5) In the step (b), the periphery of the pillar-form semiconductor deposition except for the arc-shaped portions may be formed outside line segments joining adjacent of the arc-shaped portions, in the plane including the designed inner edge of the current constriction layer.

DETAILED DESCRIPTION OF THE EMBODIMENTS

The present invention is now described in terms of a number of preferred embodiments, with reference to the drawings.

First Embodiment

A. Device Manufacturing Process

Figure 4:
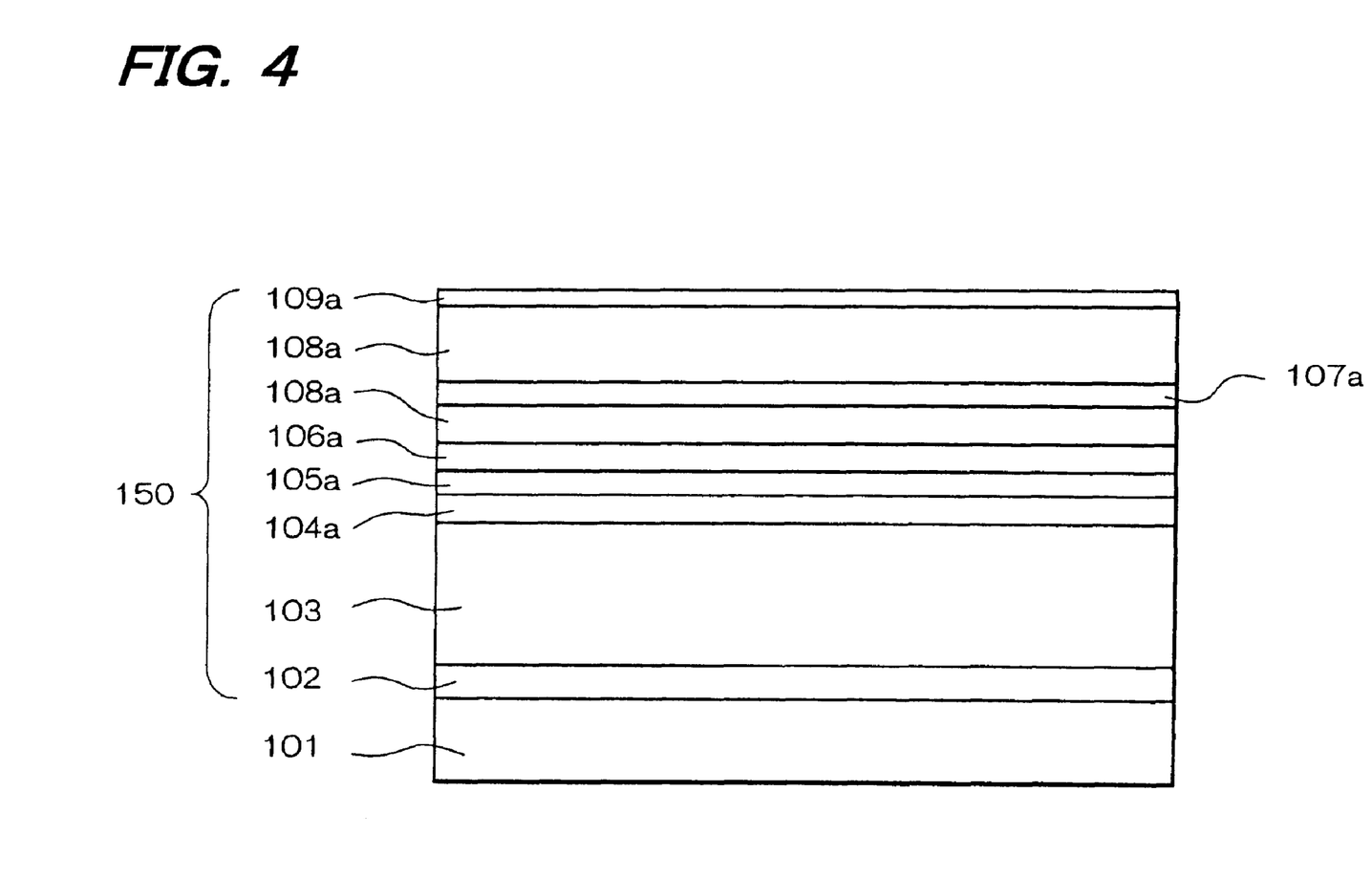
FIG. 4 is a sectional view, schematically showing a first step in the method of manufacturing the first embodiment of the surface emitting semiconductor laser of the present invention.
Figure 5:
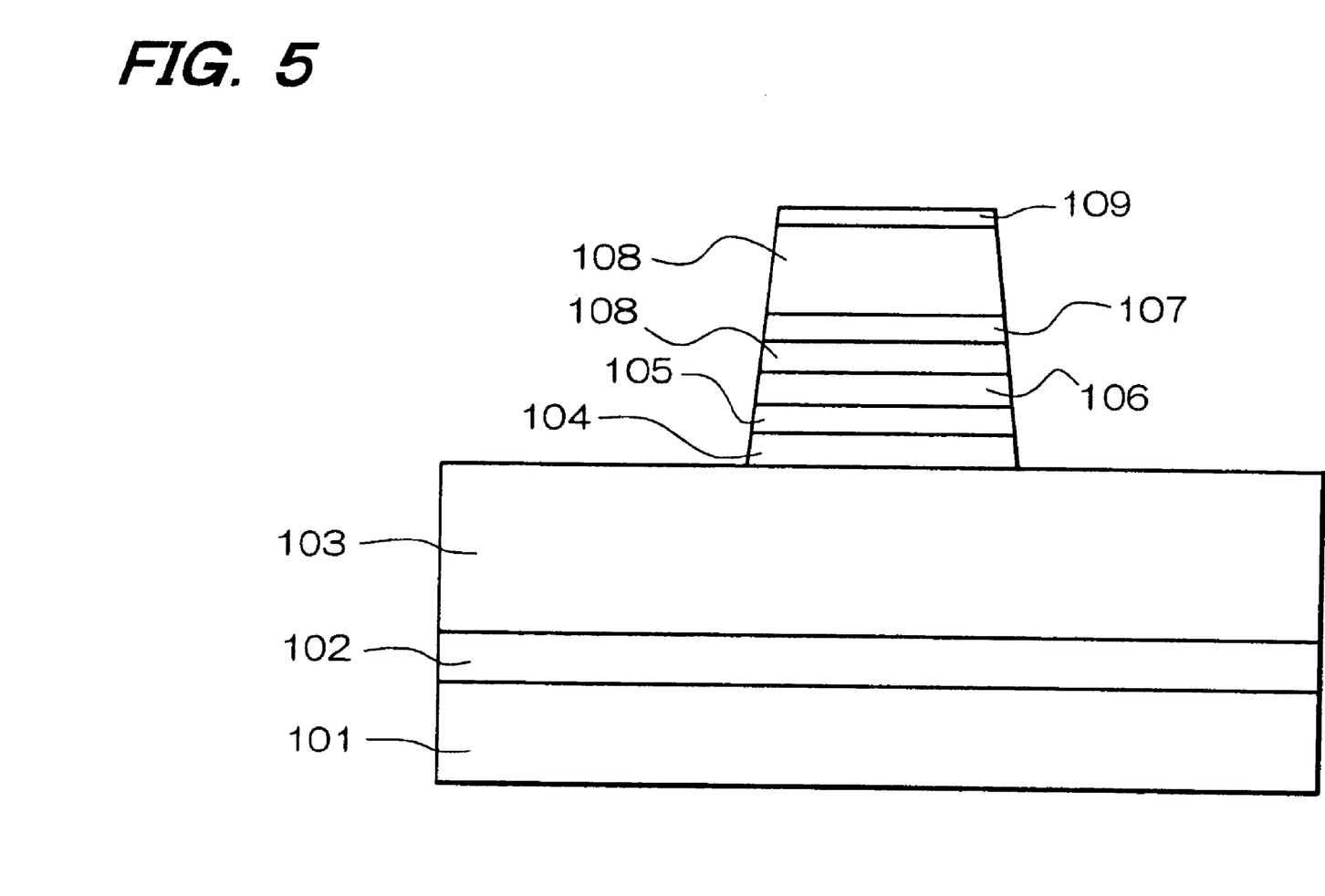
FIG. 5 is a sectional view, schematically showing a second step in the method of manufacturing the first embodiment of the surface emitting semiconductor laser of the present invention.
Figure 6:
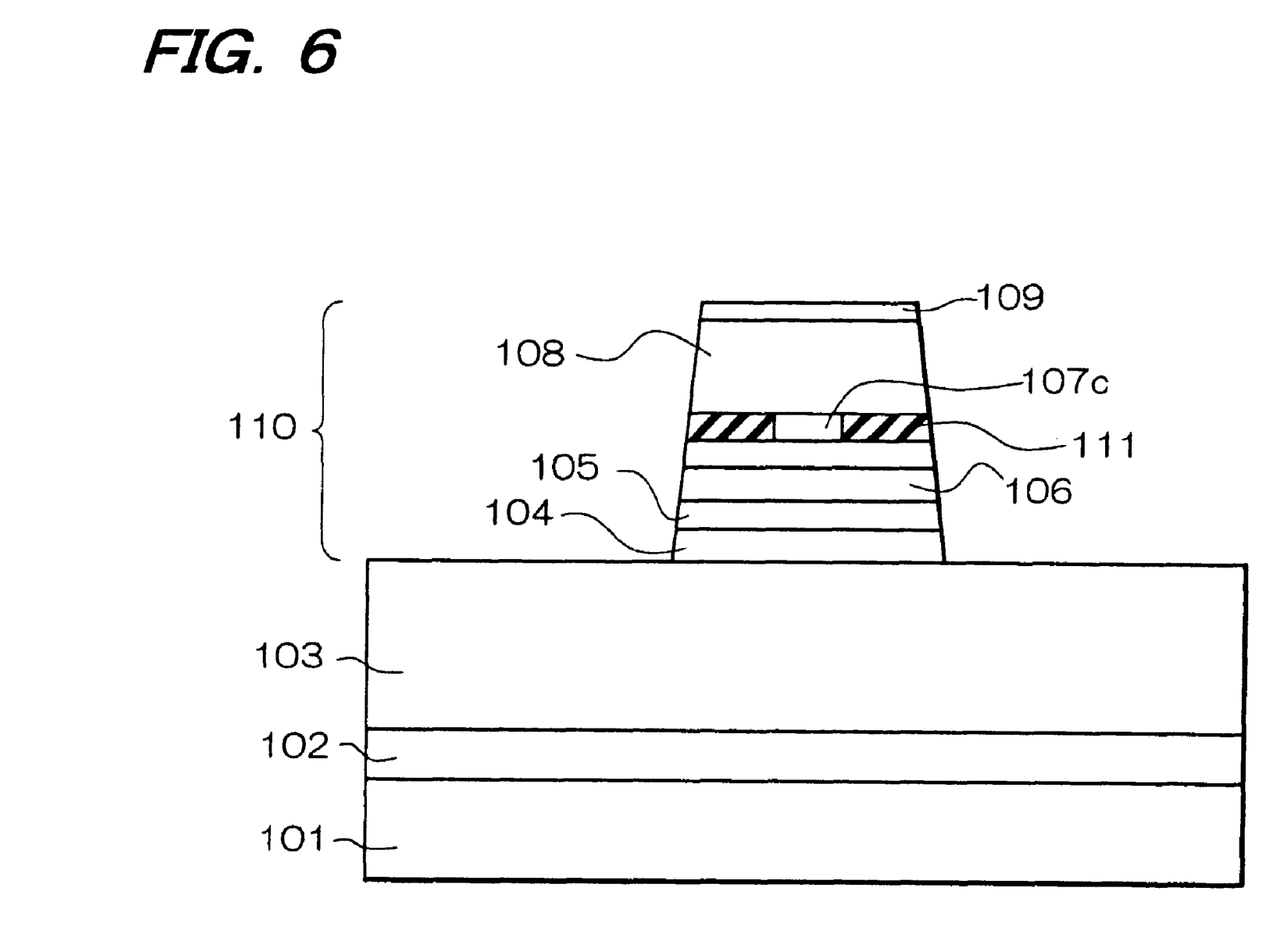
FIG. 6 is a sectional view, schematically showing a third step in the method of manufacturing the first embodiment of the surface emitting semiconductor laser of the present invention.
Figure 7:
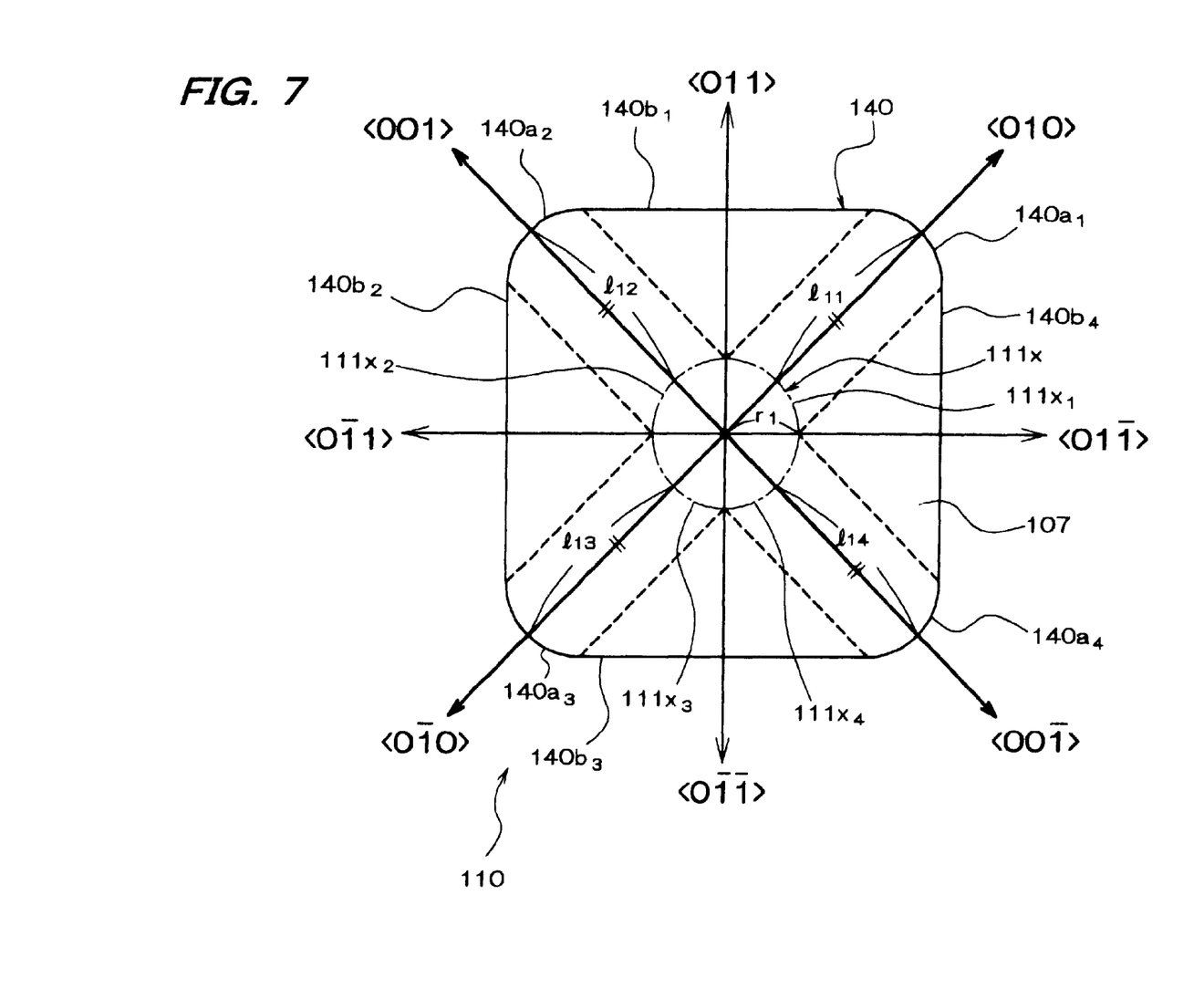
FIG. 7 schematically shows a cross-section of a pillar portion formed in the manufacturing process of the first embodiment of the surface emitting semiconductor laser of the present invention, taken in the plane including the current constriction layer formation layer.

First, the method of manufacturing the first embodiment of the surface emitting semiconductor laser (referred to hereinafter as "surface emitting laser") 100 of the present invention is described with reference to FIGS. 4 to 7. FIGS. 4 to 6 are sectional views, schematically showing the manufacturing process of a surface emitting laser 100 of this embodiment. FIG. 7 schematically shows a cross-section of a pillar portion 110 formed in the manufacturing process of the first embodiment of the surface emitting laser 100 shown in FIG. 5, in the plane including a current constriction layer formation layer 107a.

The method of manufacturing the surface emitting laser 100 of this embodiment comprises principally the following steps (a) to (c).

Step (a) is principally a step of laminating on a semiconductor substrate 101 having Miller indices (100), semiconductor deposition layers 150 including a current constriction layer formation layer 107a.

Step (b) is principally a step of etching the semiconductor deposition layers 150 to form the pillar portion 110. By means of this step, in the plane including the current constriction layer formation layer 107a, the particular form of the inner edge 111a of a current constriction layer 111 to be formed in a later step is designed to a particular shape (the circle 111x shown in FIG. 7), and from the center of the inner edge of the designed current constriction layer 111 in each of the <010> direction, <001> direction, <0-10> direction, and <00-1> direction, the pillar portion 110 is formed to include in an edge 140, respective arc-shaped portions $140a_1$, $140a_2$, $140a_3$, and $140a_4$ which approximate parts of the shape of the designed inner edge of the current constriction layer 111.

Step (c) is principally a step of oxidizing the current constriction layer formation layer 107 from its lateral surface, to form from the current constriction layer formation layer 107 the current constriction layer 111 having a shape substantially the same as the designed particular shape (the circle 111x).

Figure 1:
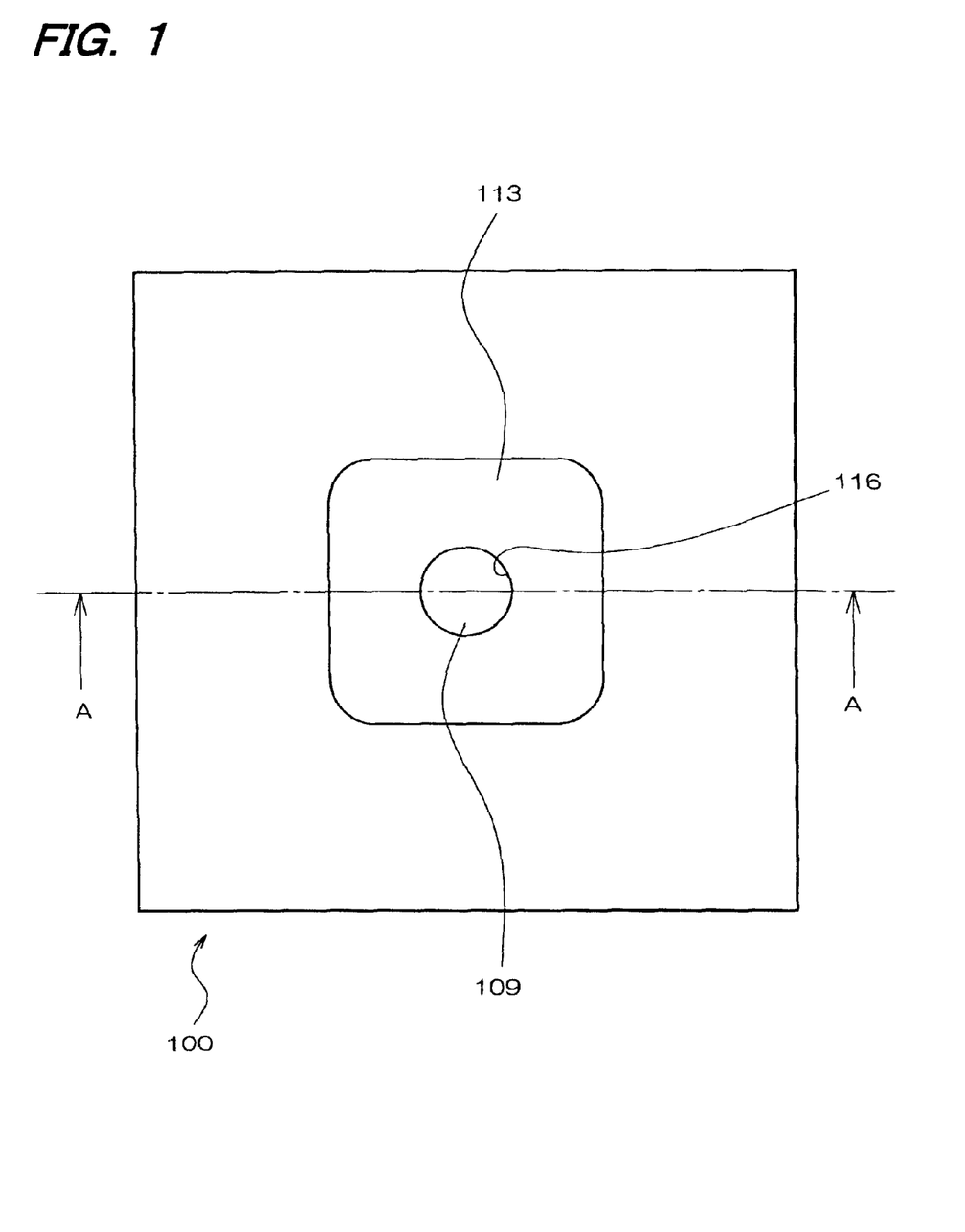
FIG. 1 schematically illustrates a first embodiment of a surface emitting semiconductor laser of the present invention, showing a part in plan view seen from the direction opposing the emission aperture of the laser light.

By means of the above steps, the surface emitting laser 100 shown in FIG. 1 is obtained.

First, step (a) is described.

(a) On the surface of a semiconductor substrate 101 of for example n-type GaAs, having Miller indices (100), the semiconductor deposition layers 150 shown in FIG. 4 are formed, by epitaxial growth while varying the composition. Here the semiconductor deposition layers 150 comprise, for example, a buffer layer 102 of n-type GaAs, a lower mirror 103 of laminated alternate layers of n-type $Al_{0.9}Ga_{0.1}As$ and n-type $Al_{0.2}Ga_{0.8}As$, an n-type cladding layer 104a of n-type $Al_{0.5}Ga_{0.5}As$, an active layer 105a comprising GaAs well and $Al_{0.3}Ga_{0.7}As$ barrier layers in which the well layers form a three-layer multiple well construction, a p-type cladding layer 106a of $Al_{0.5}Ga_{0.5}As$, a current constriction layer 107a of p-type AlAs, an upper mirror 108a of laminated alternate layers of p-type $Al_{0.9}Ga_{0.1}As$ and p-type $Al_{0.2}Ga_{0.8}As$, and a contact layer 109a of p-type GaAs, in that order. That is to say, the semiconductor deposition layers 150 are formed by depositing these layers in sequence on the semiconductor substrate 101. The surface of the semiconductor substrate 101 is the surface of the semiconductor substrate 101 on which a resonator 120 is formed in a later step.

Here for the purpose of forming the current constriction layer 111 within the pillar portion 110 in a step described below, the current constriction layer formation layer 107a is formed of p-type AlAs of thickness 30 nm within the upper mirror 108a. It should be noted that the position of provision of the current constriction layer 111 is not limited to this location, and it can be provided from immediately above the p-type cladding layer 106a to a position at approximately the mid-point of the thickness of the upper mirror 108a.

The temperature during epitaxial growth is appropriately determined, according to the type of the semiconductor substrate 101, and the type and thickness of the semiconductor deposition layers 150, but in general, epitaxial growth can be carried out at 600 to 800° C. The time for the process of epitaxial growth can be determined appropriately in a similar way to the temperature. For the method of epitaxial growth may be used metal-organic vapor phase epitaxy (MOVPE), molecular beam epitaxy (MBE), or liquid phase epitaxy (LPE).

Next, step (b) is described.

(b) Next, on the contact layer 109a, a photoresist (not shown in the drawings) is applied, and then by a process of photolithography the photoresist is patterned, whereby a resist layer (not shown in the drawings) of a prescribed pattern is formed. Next, with this resist layer as a mask, the dry etching method is used to etch the part of the resonator 120 from the laser light emission side of the surface emitting laser 100 to the n-type cladding layer 104a, that is to say, the contact layer 109a, upper mirror 108a, current constriction layer formation layer 107a, p-type cladding layer 106a, active layer 105a, and n-type cladding layer 104a, to form the pillar portion 110 as shown in FIG. 5. Here the pillar portion 110 refers to a part of the resonator 120, being a pillar-form semiconductor deposition. By means of the above, as seen from the laser light emission side an approximate square of side 20 μm is etched, and the contact layer 109, upper mirror 108, current constriction layer formation layer 107, p-type cladding layer 106, active layer 105, and n-type cladding layer 104 are formed. It should be noted that in this step, the layers etched are not restricted to these, and are determined appropriately according to the form of the target resonator.

The form of the pillar portion 110 formed here by etching is now described in detail.

In the process of forming the surface emitting laser using a semiconductor substrate having Miller indices (100), when the current constriction layer is formed by oxidation of the current constriction layer formation layer, there is an anisotropy in the rate of oxidation of the current constriction layer formation layer related to the crystalline orientation of the semiconductor substrate. Specifically, the rate of oxidation of the current constriction layer formation layer is highest in the <010> direction, <001> direction, <0-10> direction, and <00-1> direction, and the current constriction layer is formed with these directions given priority.

Figure 3:
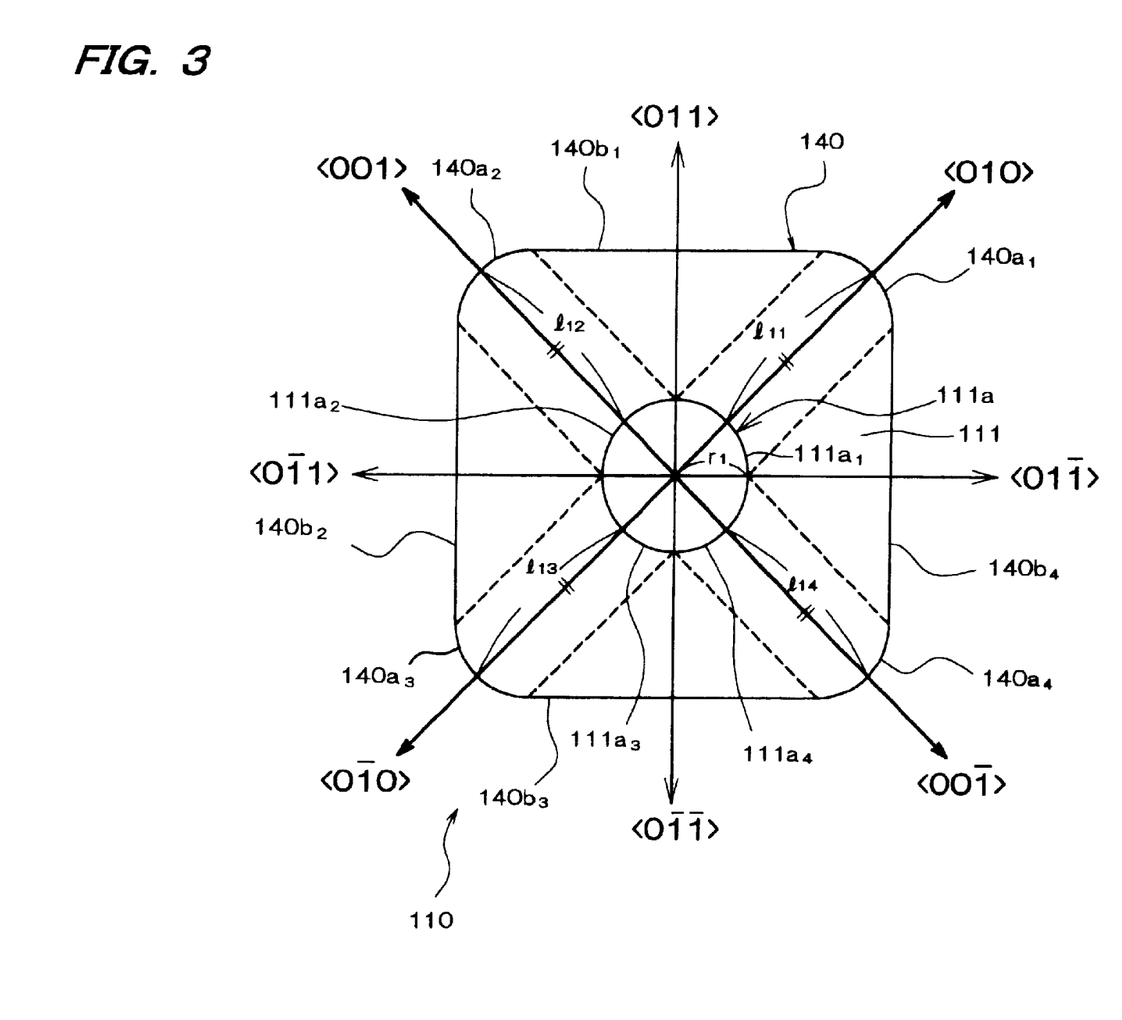
FIG. 3 schematically shows a cross-section of the surface emitting semiconductor laser shown in FIG. 1, taken in the plane including the current constriction layer.

In the present invention, in consideration of the above described facts, that is to say, the anisotropy in the rate of oxidation of the current constriction layer formation layer 107 according to the crystalline orientation of the semiconductor substrate 101, the pillar portion 110 is formed so that the shape of the edge 140 reflects the desired shape and size of the inner edge 111a of the current constriction layer 111 (see FIG. 3).

Specifically, first, as shown in FIG. 7, in the plane including the current constriction layer formation layer 107, the current constriction layer 111 is envisaged as being formed so that its inner edge constitutes the circle 111x of radius $r_1$ (broken line portion). In other words, first the shape of the inner edge of the current constriction layer 111 is designed. Next, from the center of the designed inner edge of the current constriction layer 111, the circle 111x is split in the <01-1> direction, <011> direction, <0-11> direction, and <0-1-1> direction, and the resulting arc-shaped portions $111x_1$, $111x_2$, $111x_3$, and $111x_4$ are projected respectively in the <010> direction, <001> direction, <0-10> direction, and <00-1> direction to result in arc-shaped portions $140a_1$, $140a_2$, $140a_3$, and $140a_4$ and the pillar portion 110 is formed so that these are included in the edge 140 shape. That is to say, the arc-shaped portions $140a_1$, $140a_2$, $140a_3$, and $140a_4$ have substantially the same shape and size as the respective arc-shaped portions $111x_1$, $111x_2$, $111x_3$, and $111x_4$, and are formed substantially in concentric circles.

The arc-shaped portions $111x_1$, $111x_2$, $111x_3$, and $111x_4$ have shapes obtained by splitting the circle $111x$ constituted by the desired inner edge of the current constriction layer 111 into fourths. Therefore, the arc-shaped portions $140a_1$, $140a_2$, $140a_3$, and $140a_4$ also similarly have the shapes obtained by splitting the circle $111x$ into fourths. Further, the arc-shaped portions $140a_1$, $140a_2$, $140a_3$, and $140a_4$ are formed in positions such that the distance $1_{11}$ between the arc-shaped portions $140a_1$ and $111x_1$, the distance $1_{12}$ between the arc-shaped portions $140a_2$ and $111x_2$, the distance $1_{13}$ between the arc-shaped portions $140a_3$ and $111x_3$, and the distance $1_{14}$ between the arc-shaped portions $140a_4$ and $111x_4$ are equal.

In the plane including the current constriction layer formation layer 107, as shown in FIG. 7, the shape of the edge 140 of the pillar portion 110 other than the arc-shaped portions $140a_1$, $140a_2$, $140a_3$, and $140a_4$ is constituted by line segments $140b_1$, $140b_2$, $140b_3$, and $140b_4$ joining adjacent pairs of these arc-shaped portions. In this embodiment, the shape of the edge 140 of the pillar portion 110 is shown as including the line segments $140b_1$, $140b_2$, $140b_3$, and $140b_4$, but the shape of the edge 140 of the pillar portion 110 is not limited thereto. Aside from the arc-shaped portions $140a_1$, $140a_2$, $140a_3$, and $140a_4$, the shape of the edge 140 of the pillar portion 110 can be formed to extend outside the line segments $140b_1$, $140b_2$, $140b_3$, and $140b_4$.

From the above, as shown in FIG. 7, in the plane including the current constriction layer formation layer 107, the pillar portion 110 is formed so that the shape of the edge 140 thereof is constituted by the arc-shaped portions $140a_1$, $140a_2$, $140a_3$, and $140a_4$, and the line segments $140b_1$, $140b_2$, $140b_3$, and $140b_4$.

Next, step (c) is described.

The current constriction layer formation layer 107 formed from a p-type AlAs layer is exposed to an atmosphere of steam at about 400° C. By means of this step, the AlAs layer is oxidized from its lateral surface, and the insulator aluminum oxide is formed. That is to say, the current constriction layer formation layer 107 is oxidized from its lateral surface, and as shown in FIG. 6, the current constriction layer 111 including the aluminum oxide, and a current flow region layer 107c having its periphery surrounded by the current constriction layer 111 (the part of the current constriction layer formation layer 107 not converted to the current constriction layer 111) is formed. In FIG. 6, a section through the plane containing the current constriction layer 111 is shown in FIG. 3. As shown in FIG. 3, by means of the above described process, a current constriction layer 111 of the desired shape is obtained. That is to say, in the plane including the current constriction layer 111, the current constriction layer 111 having an inner edge 111a forming a circle of radius $r_1$ is obtained. The inner edge 111a shown in FIG. 3 has substantially the same shape and size as the designed circle $111x$ (see FIG. 7), and is formed in substantially the same position. By means of the above process, the resonator 120 is formed on the semiconductor substrate 101.

Next, using CVD with monosilane as the raw material, an insulating layer 112 formed by a silicon oxide film (SiOx film) is formed on a part of the lateral surface of the pillar portion 110 and the upper surface of the lower mirror 103. The type of insulating layer is not limited to a silicon oxide film, and a silicon nitride film (SiNx film) or other insulating film may be used. Alternatively, an embedding construction may be used, using a resin material such as polyimide. Next, on the part of the upper surface of the insulating layer 112 and the lateral surface of the pillar portion 110 on which the insulating layer 112 is not formed, an alloy layer (not shown in the drawings) being an alloy of gold and zinc is formed by vacuum deposition. Next, using photolithography, the alloy layer is patterned to form an upper electrode 113, and further, on the reverse side of the semiconductor substrate 101 (the surface of the semiconductor substrate 101 opposite to that on which the resonator 120 is formed) a lower electrode 115 is formed by vacuum deposition, of an alloy of gold and germanium. Finally, the construction obtained by the above process is heat treated at 350 degrees C., to provide ohmic contact between the upper electrode 113 and the resonator 120 and the lower electrode 115. By means of the above process, the surface emitting laser 100 shown in FIG. 1 is obtained.

B. Device Construction

Figure 2:
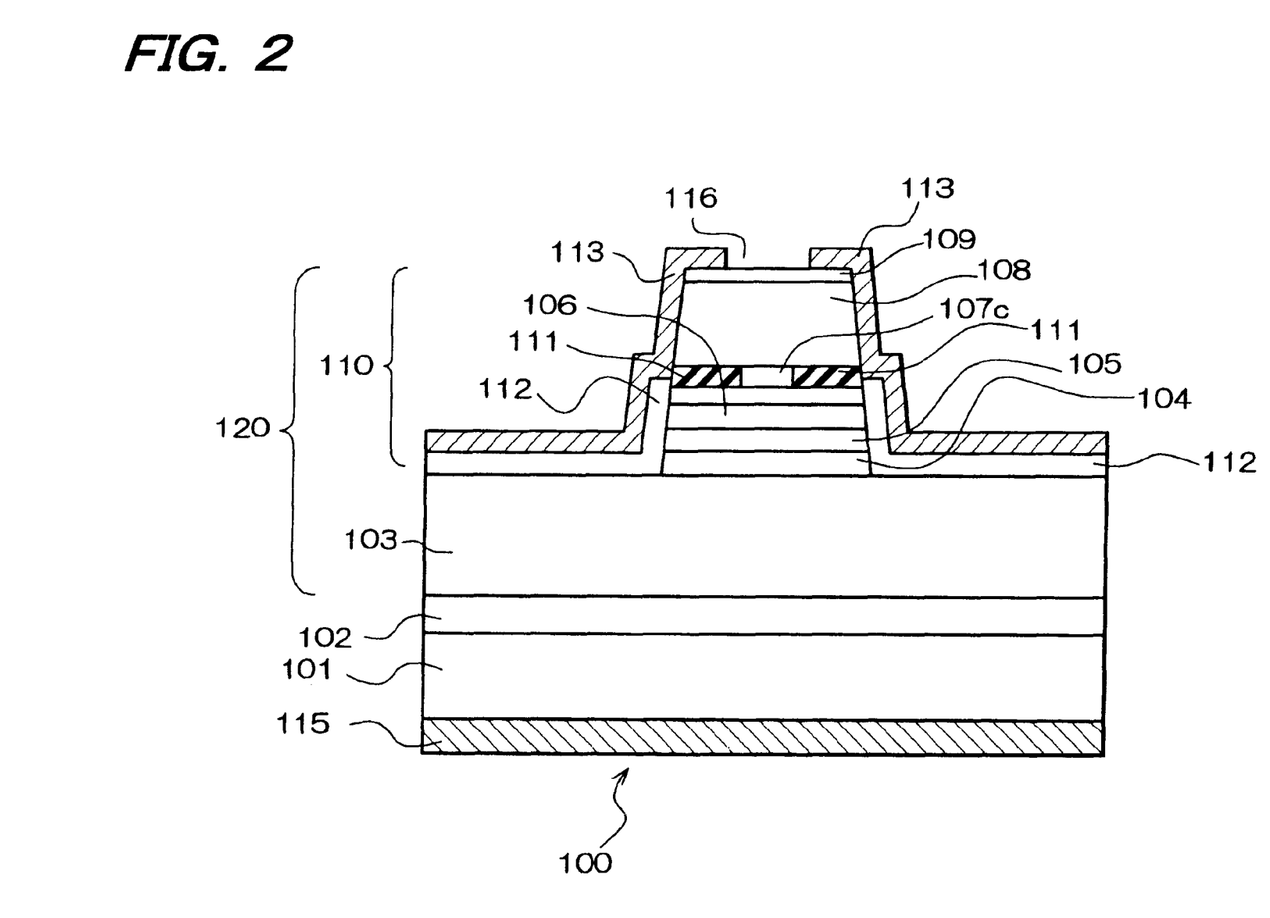
FIG. 2 schematically shows a cross-section of the surface emitting semiconductor laser shown in FIG. 1, taken along the line A—A.

The surface emitting laser 100 obtained from the above described manufacturing process is shown in FIGS. 1 to 3. FIG. 1 schematically illustrates the surface emitting laser 100 of this embodiment, showing a part in plan view seen from the direction opposing the emission aperture of the laser light. FIG. 2 schematically shows a cross-section along the line A—A of the surface emitting laser 100 shown in FIG. 1. FIG. 3 schematically shows a cross-section of the surface emitting laser 100 shown in FIG. 1, taken in the plane including the current constriction layer 111.

The surface emitting laser 100 has the semiconductor substrate 101 having Miller indices (100), on which is formed the resonator 120 including the pillar portion 110. The resonator 120 is formed from layers including the lower mirror 103, active layer 105, and upper mirror 108. On the upper surface of the pillar portion 110, the upper electrode 113 is formed of an alloy of gold and zinc. On the surface of the semiconductor substrate 101 opposite to that on which the resonator 120 is formed, the lower electrode 115 is formed of an alloy of gold and germanium.

The current constriction layer 111 is formed in the pillar portion 110, and as described above, in the plane including the current constriction layer 111, the shape of the edge 140 of the pillar portion 110 includes arc-shaped portions $140a_1$, $140a_2$, $140a_3$, and $140a_4$ which approximate parts of the shape of the inner edge 111a of the current constriction layer 111.

The arc-shaped portions $140a_1$, $140a_{21}$, $140a_3$, and $140a_4$ are formed respectively in the <010> direction, <001> direction, <0-10> direction, and <00-1> direction from the center of the inner edge 111a of the current constriction layer 111. The arc-shaped portions $140a$, $140a_2$, $140a_3$, and $140a_4$ are formed substantially in concentric circles with part of the shape of the inner edge 111a of the current constriction layer 111. That is to say, the arc-shaped portions $140a_1$, $140a_2$, $140a_3$, and $140a_4$ are the projection in the <010> direction, <001> direction, <0-10> direction, and <00-1> direction respectively of the arc-shaped portions $111a_1$, $111a_2$, $111a_3$, $111a_4$ obtained by splitting the inner edge 111a of the current constriction layer 111 from the center of the inner edge 111a of the current constriction layer 111 in the <01-1> direction, <011> direction, <0-11> direction, and <01-1> direction into fourths of the inner edge 111a.

Further, the distance $1_{11}$ between the arc-shaped portion $111a_1$ and arc-shaped portion $140a_1$, the distance 112 between the arc-shaped portion $111a_2$ and arc-shaped portion $140a_2$, the distance $1_{13}$ between the arc-shaped portion $111a_3$ and arc-shaped portion $140a_3$, and the distance $1_{14}$ between the arc-shaped portion $111a_4$ and arc-shaped portion $140a_4$ are respectively substantially equal.

As described above, in the plane including the current constriction layer 111, as shown in FIG. 3, the shape of the edge 140 of the pillar portion 110 is constituted by the arc-shaped portions $140a_1$, $140a_2$, $140a_3$, and $140a_4$, and line segments $140b_1$, $140b_2$, $140b_3$, and $140b_4$ joining adjacent pairs of these arc-shaped portions.

C. Operation of the Device

The general operation of the surface emitting laser 100 of this embodiment is as follows.

When a forward potential is applied between the upper electrode 113 and lower electrode 115 of the pin diode constituted by the upper mirror 108, active layer 105, and lower mirror 103, in the active layer 105, recombination of electrons and positive holes occurs, and light is emitted as a result of this recombination. As the generated light bounces between the upper mirror 108 and lower mirror 103, stimulated emission occurs, and the strength of the light is amplified. When the optical gain exceeds the optical loss, laser generation occurs, and laser light is emitted in a direction perpendicular to the semiconductor substrate 101 from an aperture 116 in the upper electrode 113.

D. Effect and Benefit

Next, the effect and benefit of the surface emitting laser 100 of this embodiment and method of manufacturing the same is described.

(1) As a result of concentrated research into the oxidation of the current constriction layer formation layer when forming the current constriction layer, the present inventors have discovered the presence of anisotropy in the rate of oxidation of the current constriction layer formation layer in relation to the crystalline orientation of the semiconductor substrate, and have proposed the present invention. That is to say, according to the method of manufacturing the surface emitting laser 100 of this embodiment, the presence of anisotropy in the rate of oxidation of the current constriction layer formation layer 107 in relation to the crystalline orientation of the semiconductor substrate 101 is taken into account, and the shape and size of the inner edge 111a of the current constriction layer 111 to be formed in a later stage is designed in advance, and the pillar portion 110 is formed to reflect the shape and size of the designed inner edge 111a of the current constriction layer 111. By oxidizing the current constriction layer formation layer 107 from the lateral surface of the thus obtained pillar portion 110, a current constriction layer 111 with the inner edge 111a having the desired shape and size is obtained. In the process of manufacturing the surface emitting laser of this embodiment, the surface emitting laser 100 is obtained with a current constriction layer 111 whose inner edge 111a forms a true circle. Therefore, by means of this surface emitting laser 100, laser light can efficiently be obtained with a beam shape closer to a true circle.

Figure 10:
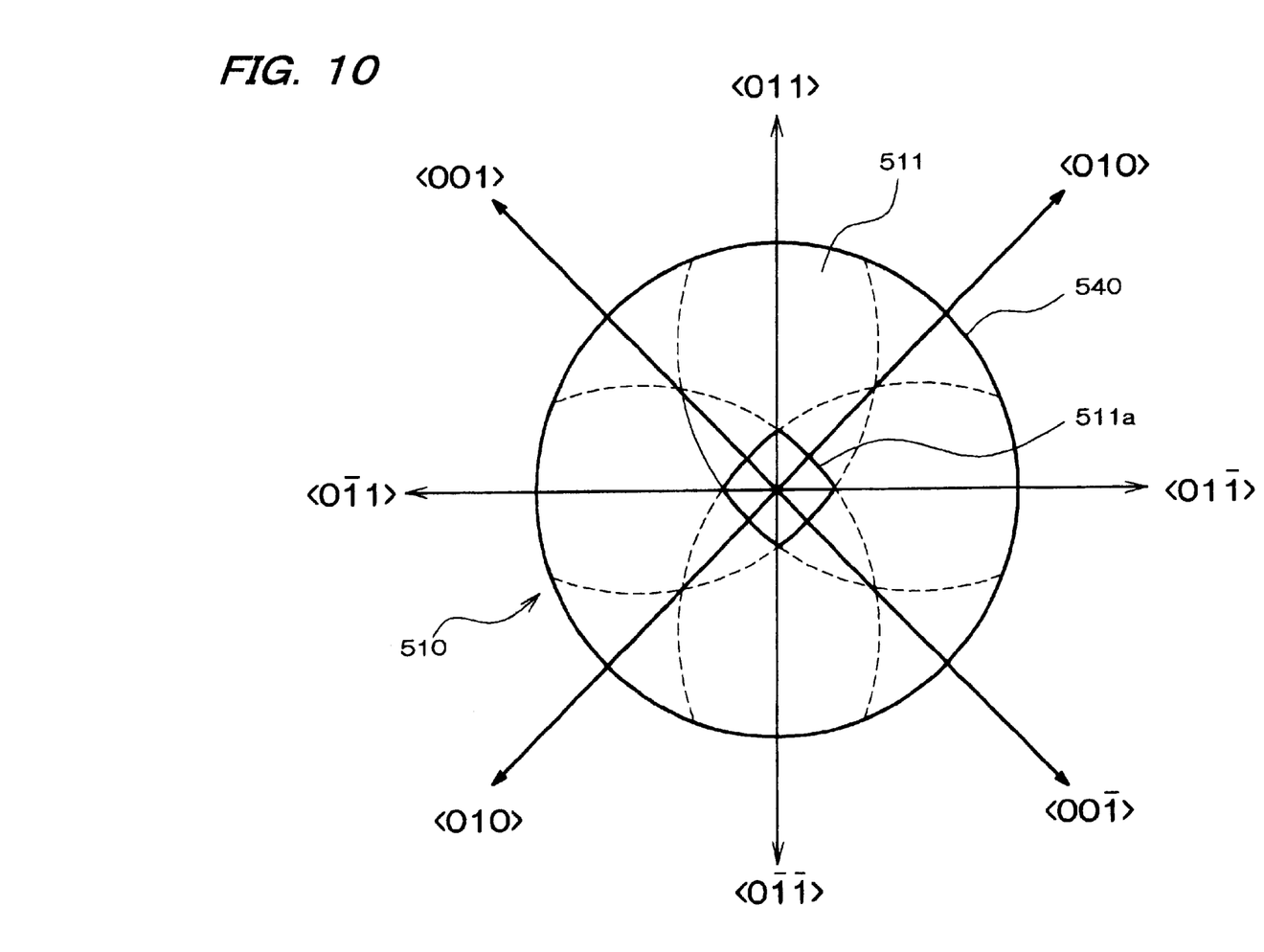
FIG. 10 schematically shows a cross-section of a pillar portion of a general surface emitting semiconductor laser, taken in the plane including the current constriction layer.

On the other hand, in an ordinary surface emitting laser (see FIG. 10) in which, for example, a pillar portion 510 is formed on a semiconductor substrate having Miller indices (100) with a circular shape in plan view, then since the oxidation proceeds with priority in the above described <010> direction, <001> direction, <0-10> direction, and <00-1> direction, the shape of the inner edge 511a of a current constriction layer 511 reflects the shape of the periphery 540 of the pillar portion 510. That is to say, the shape of the inner edge 511a of the current constriction layer 511 has approximately the same curvature as the periphery 540 of the pillar portion 510. Therefore, the shape of the inner edge 511a of the current constriction layer 511 is not a true circle, but as shown in FIG. 10, approaches a rhombus. Thus, if the shape of the inner edge 511a of the current constriction layer 511 is not a true circle, laser light the shape of a true circle cannot be efficiently obtained. Therefore, such a surface emitting laser may not be appropriate for use as a light source in optical communications for example using optic fibers.

(2) Since the respective distances from the center of the inner edge 111a of the current constriction layer 111 to the arc-shaped portions $140a_1$, $140a_2$, $140a_3$, and $140a_4$ are approximately equal, and the current constriction layer formation layer 107 is oxidized approximately equally in the <010> direction, <001> direction, <0-10> direction, and <00-1> direction, the shape of the inner edge 111a of the current constriction layer 111 can be made closer to a true circle.

(3) In the plane including the current constriction layer 111, except for the arc-shaped portions $140a_1$, $140a_2$, $140a_3$, and $140a_4$, the shape of the edge 140 of the pillar portion 110 includes line segments $140b_1$, $140b_2$, $140b_3$, and $140b_4$ joining adjacent of these arc-shaped portions. In the surface emitting laser 100, the shape of the parts of the edge 140 of the pillar portion 110 excluding the arc-shaped portions $140a_1$, $140a_2$, $140a_3$, and $140a_4$ can be formed to extend outside the line segments $140b_1$, $140b_2$, $140b_3$, and $140b_4$. By means of this construction, the oxidation of the current constriction layer formation layer 107 can be controlled, and the current constriction layer 111 of the desired shape and size can be obtained.

Second Embodiment

A. Device Construction

Figure 8:
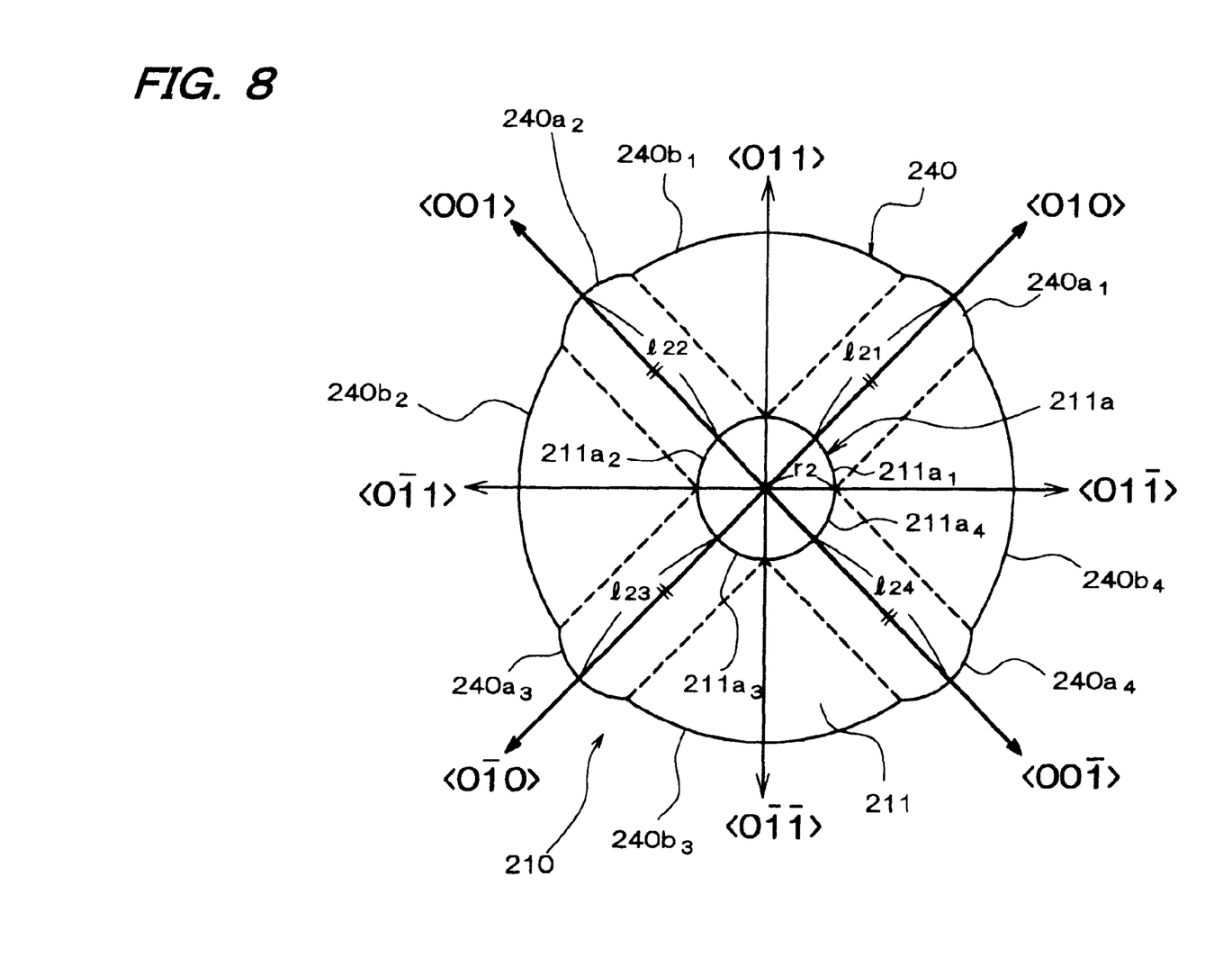
FIG. 8 schematically shows a cross-section of the second embodiment of the surface emitting semiconductor laser of the present invention, taken in the plane including the current constriction layer.

FIG. 8 is a sectional view, schematically showing a second embodiment of the surface emitting laser 200 of the present invention.

The surface emitting laser 200 of the second embodiment, as shown in FIG. 8, has substantially the same construction as the first embodiment of the surface emitting laser 100, except that in the plane including the current constriction layer 211, shape of the periphery 240 of a pillar portion 210 other than arc-shaped portions $240a_1$, $240a_2$, $240a_3$, and $240a_4$ is curved.

The surface emitting laser 200 has the pillar portion 210 and current constriction layer 211. The pillar portion 210 and current constriction layer 211 have the same functions as the pillar portion 110 and current constriction layer 111 included in the first embodiment of the surface emitting laser 100.

Paying attention to the shape of the pillar portion 210, the shape of the periphery 240 of the pillar portion 210 is similar to the shape of the edge 140 of the pillar portion 110 insofar as it includes arc-shaped portions $240a_1$, $240a_2$, $240a_3$, and $240a_4$. Similarly, the distance $1_{21}$ between the arc-shaped portion $211a$ and arc-shaped portion $240a_1$, the distance 122 between the arc-shaped portion $211a_2$ and arc-shaped portion $240a_2$, the distance $1_{23}$ between the arc-shaped portion $211a_3$ and arc-shaped portion $240a_3$, and the distance $1_{24}$ between the arc-shaped portion $211a_4$ and arc-shaped portion $240a_4$ are respectively substantially equal.

On the other hand, in the shape of the periphery 240 of the pillar portion 210, the lines joining adjacent of the arc-shaped portions $240a_1$, $240a_2$, $240a_3$, and $240a_4$ are formed from curved lines $240b_1$, $240b_2$, $240b_3$, and $240b_4$, and the overall shape of the periphery 240 is an approximate circle, and differs from the shape of the edge 140 of the pillar portion 110 constituted by the straight line segments $140b_1$, $140b_2$, $140b_3$, and $140b_4$.

B. Device Manufacturing Process

Except insofar as during the formation of the pillar portion 210, in the plane including the current constriction layer 211, as shown in FIG. 8, the pillar portion 210 is formed so that the shape of the periphery 240 of the pillar portion 210 is curved, the method of manufacturing the second embodiment of the surface emitting laser 200 is substantially the same as the method of manufacturing the first embodiment of the surface emitting laser 100. Description of the manufacturing process is thus omitted here.

C. Operation, Effect and Benefit of the Device

The second embodiment of the surface emitting laser 200 provides the same operation as the first embodiment of the surface emitting laser 100, and further the same effect and benefit. Description is therefore omitted here.

Third Embodiment

A. Device construction

Figure 9:
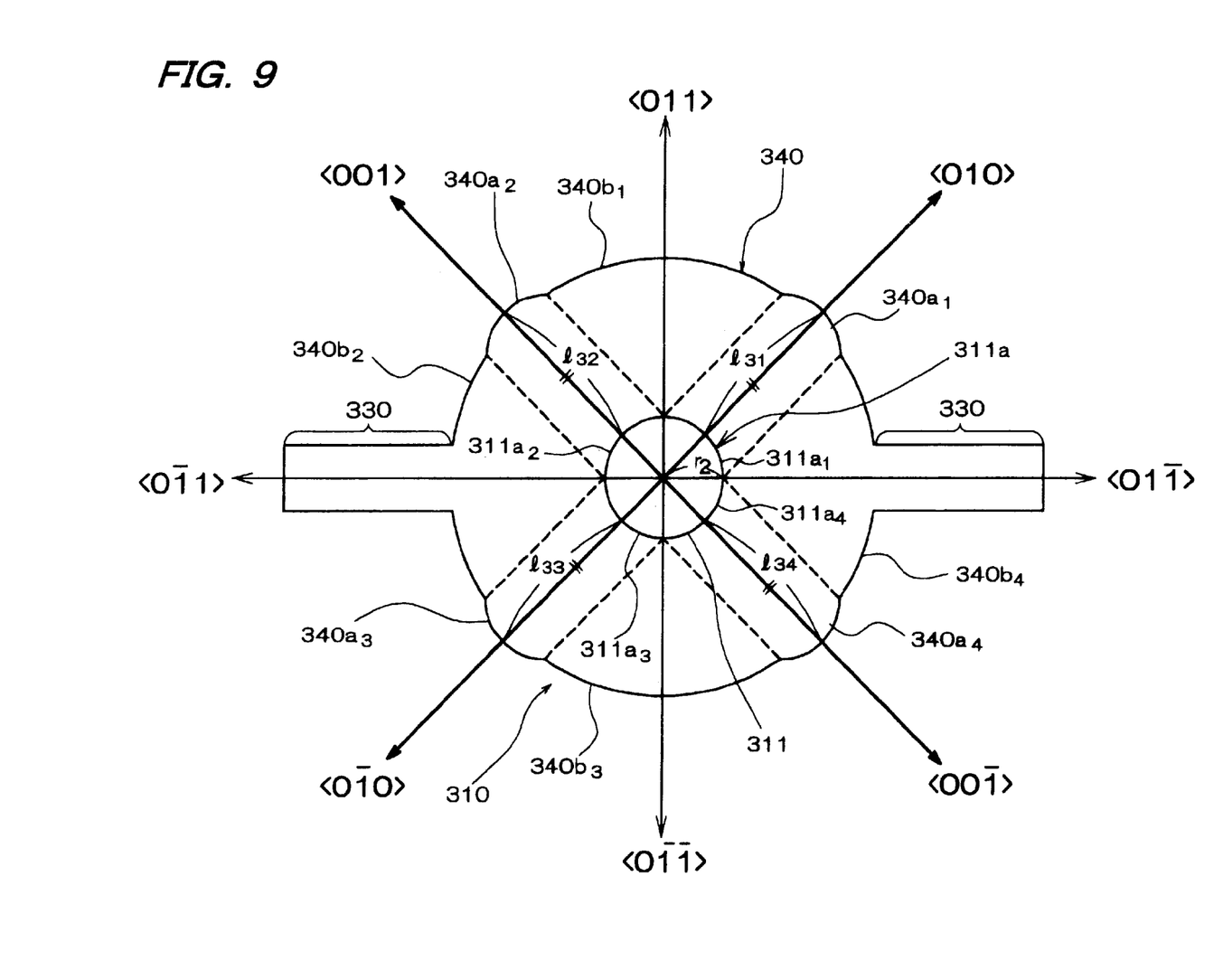
FIG. 9 schematically shows a cross-section of the third embodiment of the surface emitting semiconductor laser of the present invention, taken in the plane including the current constriction layer.

FIG. 9 is a sectional view, schematically showing a surface emitting laser 300 of the third embodiment of the present invention.

The third embodiment of the surface emitting laser 300 has substantially the same construction as the second embodiment of the surface emitting laser 200, except that on a pillar portion 310 is formed a strain application portion 330 which generates a strain in the active layer (not shown in the drawings). The shape of the periphery 340 of the pillar portion 310, like the pillar portion 210, is constituted by arc-shaped portions $340a_1$, $340a_2$, $340a_3$, and $340a_4$, and curved lines $340b_1$, $340b_2$, $340b_3$, and $340b_4$ joining adjacent of the arc-shaped portions. Further, the distance $1_{31}$ between the arc-shaped portion $311a$, and arc-shaped portion $340a_1$, the distance $1_{32}$ between the arc-shaped portion $311a_2$ and arc-shaped portion $340a_2$, the distance $1_{33}$ between the arc-shaped portion $311a_3$ and arc-shaped portion $340a_3$, and the distance $1_{34}$ between the arc-shaped portion $311a_4$ and arc-shaped portion $340a_4$ are respectively substantially equal.

The surface emitting laser 300 has the pillar portion 310 and a current constriction layer 311. The pillar portion 310 and current constriction layer 311 provide the same functions as the pillar portion 210 and current constriction layer 211 included in the second embodiment of the surface emitting laser 200. Except for the strain application portion 330, the pillar portion 310 has a similar shape and construction to the pillar portion 210.

B. Device Manufacturing Process

Except, as shown in FIG. 9, for forming the strain application portion 330 pillar portion 310 when forming the pillar portion 310, the method of manufacturing the third embodiment of the surface emitting laser 300 is substantially the same as the method of manufacturing the second embodiment of the surface emitting laser 200. Description of the manufacturing process is thus omitted here.

C. Operation, Effect and Benefit of the Device

The operation of the third embodiment of the surface emitting laser 300 is the same as the operation of the first and second embodiments of the surface emitting laser 100 and 200. Description is therefore omitted here.

The third embodiment of the surface emitting laser 300 provides substantially the same effect and benefit as the effect and benefit of the first and second embodiments of the surface emitting laser 100 and 200, and further provides the following benefit.

In the third embodiment of the surface emitting laser 300, by virtue of the strain application portion 330 being formed on the pillar portion 310, laser light emission polarized in directions perpendicular to the directions of extension of the strain application portion 330 can be obtained. Here the directions of extension of the strain application portion 330 are the <01-1> direction and <0-11> direction shown in FIG. 9, and by the directions perpendicular to the direction of extension of the strain application portion 330 are indicated the <011> direction and <0-1-1> direction shown in FIG. 9.

It should be noted that the strain application portion 330 is formed in portions of the periphery of the pillar portion 310 other than the arc-shaped portions $340a_1$, $340a_2$, $340a_3$, and $340a_4$. Therefore, the polarization of the laser light can be controlled without affecting the shape of the current constriction layer 311.

It should be noted that in the above described embodiments, the p-type and n-type semiconductor layers may be interchanged, without departing from the essence of the present invention. In the above described embodiments, the description has been of a Al—Ga—As type of material, but depending on the wavelength of radiation to be generated, other materials, for example, In—P type, In—Al—As type, Ga—In—As type, Ga—In—N type, Al—Ga—In—P type, Ga—In—N—As type, Al—Ga—In—As type, Ga—In—As—P type, and so on, of semiconductor materials can be used.

The surface emitting semiconductor laser and method of manufacturing a surface emitting semiconductor laser described in the above embodiments are examples, and various modifications can be made within the scope of the present invention. In the above described embodiments, a surface emitting laser is shown in which there is a single pillar portion, but the present invention will not suffer from being implemented with a substrate surface on which there is a plurality of pillar portions.

What is claimed is:

1. A surface emitting semiconductor laser which has a semiconductor substrate having Miller indices (100), and a resonator comprising a lower mirror, an active layer, and an upper mirror formed on the semiconductor substrate, to emit laser light from the resonator in a direction perpendicular to the semiconductor substrate, wherein:

a pillar-form semiconductor deposition is provided above the lower mirror of the resonator;

the pillar-form semiconductor deposition includes a current constriction layer;

a periphery of the pillar-form semiconductor deposition has arc-shaped portions which are similar to parts of an inner edge of the current constriction layer, in a plane including the current constriction layer, the periphery of the pillar-form semiconductor deposition not forming a circle; and the arc-shaped portions are located in the <010> direction, <001> direction, <0-10> direction and <00-1> direction from the center of the inner edge of the current constriction layer.

2. The surface emitting semiconductor laser as defined in claim 1, wherein the arc-shaped portions and the parts of the inner edge of the current constriction layer are formed in approximately concentric circles.

3. The surface emitting semiconductor laser as defined in claim 1, wherein the arc-shaped portions are formed by splitting the inner edge of the current constriction layer in the <01-1> direction, <011> direction, <0-11> direction and <0-1-1> direction from the center of the inner edge, and by projecting the split parts of the inner edge of the current constriction layer respectively in the <010> direction, <001> direction, <0-10> direction and <00-1> direction.

4. The surface emitting semiconductor laser as defined in claim 1, wherein the distances from the center of the inner edge of the current constriction layer to the arc-shaped portions are approximately equal.

5. The surface emitting semiconductor laser as defined in claim 1, wherein the arc-shaped portions have the shape of the inner edge of the current constriction layer divided into fourth.

6. The surface emitting semiconductor laser as defined in claim 1,
wherein the periphery of the pillar-form semiconductor deposition except for the arc-shaped portions is formed outside line segments joining adjacent of the arc-shaped portions, in the plane including the current constriction layer.

7. The surface emitting semiconductor laser as defined in claim 1,
wherein the periphery of the pillar-form semiconductor deposition except for the arc-shaped portions comprises curved lines, in the plane including the current constriction layer.

8. The surface emitting semiconductor laser as defined in claim 1,
wherein the periphery of the pillar-form semiconductor deposition except for the arc-shaped portions comprises straight lines, in the plane including the current constriction layer.

9. The surface emitting semiconductor laser as defined in claim 1, wherein:
a strain application portion which generates a strain in the active layer is formed in the pillar-form semiconductor deposition; and
the strain application portion is formed on the periphery of the pillar-form semiconductor deposition except for the arc-shaped portions, in the plane including the current constriction layer.

10. The surface emitting semiconductor laser as defined in claim 1,
wherein the inner edge of the current constriction layer is a true circle.

* * * * *